United States Patent [19]

Evans

[11] 4,423,385

[45] Dec. 27, 1983

[54] CHOPPER-STABILIZED AMPLIFIER

[75] Inventor: Lee L. Evans, Atherton, Ga.

[73] Assignee: Intersil, Inc., Cupertino, Calif.

[21] Appl. No.: 272,362

[22] Filed: Jun. 10, 1981

[51] Int. Cl.³ .......................... H03F 1/26; H03F 3/45
[52] U.S. Cl. ...................................... 330/9; 330/253; 330/261
[58] Field of Search ...................... 330/9, 51, 69, 252, 330/253, 257, 261

[56] References Cited

U.S. PATENT DOCUMENTS 4,050,030 9/1977 Russell ................................ 330/253

*Primary Examiner*—James B. Mullins
*Assistant Examiner*—Gene Wan
*Attorney, Agent, or Firm*—Spensley, Horn, Jubas & Lubitz

[57] ABSTRACT

An operational amplifier is provided having two input legs and a reference leg. In order to eliminate any input offset voltage between the two input legs, the reference leg is balanced against the first input leg and then against the second input leg so that the first input leg is thereby balanced against the second input leg and any offset voltage is significantly reduced or eliminated.

16 Claims, 4 Drawing Figures

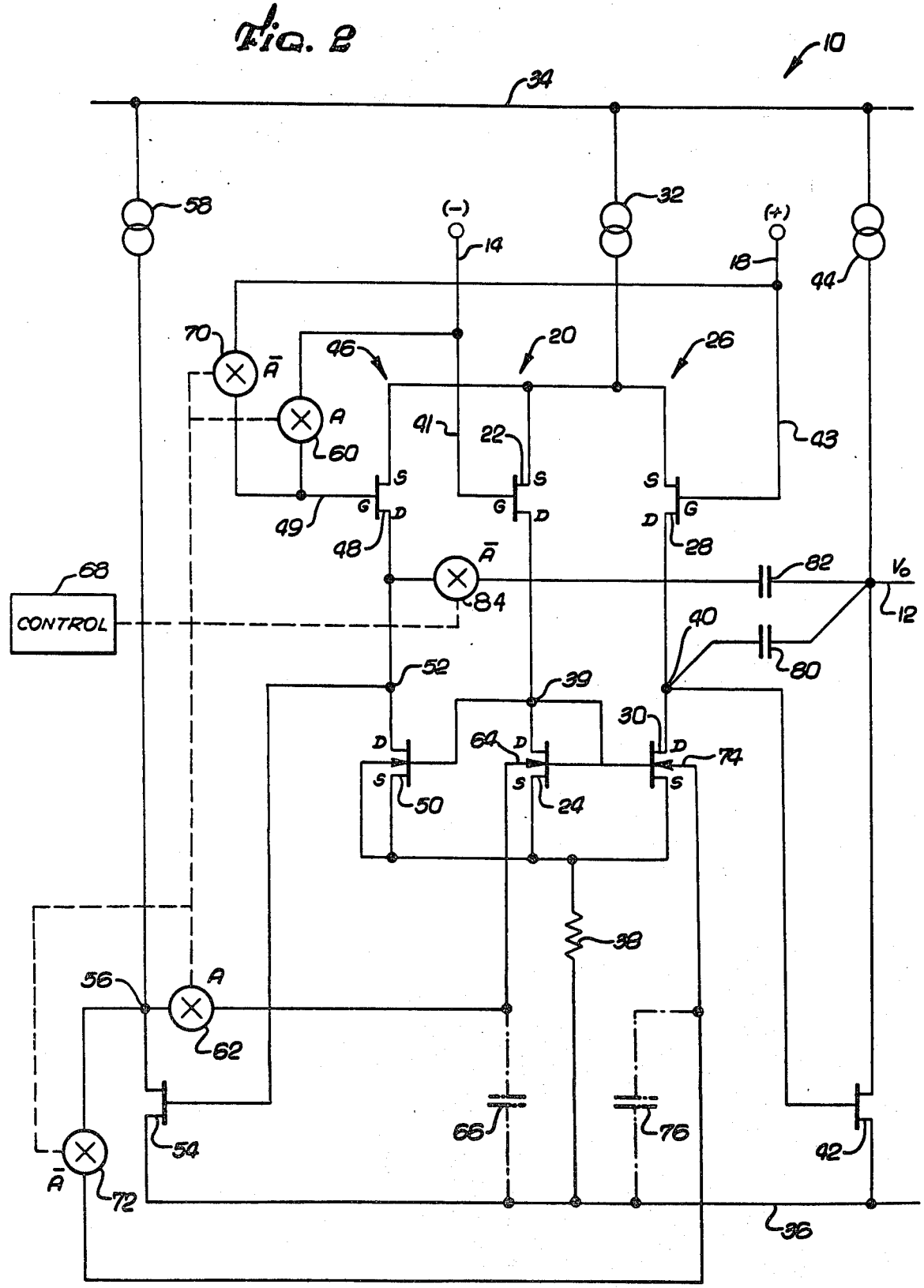

CHOPPER-STABILIZED AMPLIFIER

BACKGROUND OF THE INVENTION

2. Field of the Invention

The present invention generally relates to amplifier circuits, and more particularly, to chopper-stabilized amplifiers in which the offset error is corrected.

A differential amplifier provides a voltage at its output which is a function of the difference between the voltages at its inputs. If the inputs are shorted together, the output should be at a predetermined voltage, often at zero volts since there is a zero voltage difference between the inputs. However, because of a condition of imbalance which typically occurs within the amplifier, the output of the amplifier deviates from the expected level. This deviation is known as the amplifier offset voltage. The imbalanced condition within the amplifier may be the result of a variety of causes, such as a mismatch between the input transistors or a mismatch between the load transistors, for example.

If the amplifier is part of a circuit having a negative feedback loop, the offset voltage can be thought of as the additional input voltage necessary to drive the output to the desired level. Accordingly, the input offset voltage generally equals the output offset divided by the overall amplifier gain.

2. Description of the Prior Art

Prior attempts to correct the offset voltage problem have included the development of circuits which utilize a variable resistor to provide an adjustable voltage to one of the amplifier inputs to cancel the input offset voltage. Another method, disclosed in U.S. Pat. No. 4,050,030 to Russell, uses variable resistors to adjust the current between internal stages of the amplifier in order to eliminate the offset voltage. The offset voltage of an amplifier generally does not remain constant, however, and any change in the offset voltage thus requires additional adjustments to the variable resistors.

Other circuits have been developed in an attempt to automatically provide an adjustment to eliminate the offset voltage as the offset varies. These include chopper-stabilized amplifiers which have a separate "chopper" correction circuit intended to automatically correct the offset of the main amplifier. In one class of chopper-stabilized amplifiers, the chopper circuit periodically disconnects the inputs of the amplifier from the input signal and shorts the amplifier inputs together. Any offset appearing at the output is fed to a storage device such as a capacitor. After the inputs are reconnected to the input signal, the voltage on the capacitor is utilized to eliminate the offset voltage. These circuits, such as that shown in U.S. Pat. No. 3,988,689 to Ochi, et al. require the periodic disconnection of the input signal source from the inputs of the amplifier to replenish the capacitor. The disconnection of the amplifier inputs from the input source causes the output signal to be "chopped." The amplifier disclosed in the Ochi patent includes additional circuitry to reduce any discontinuity in the output signal.

Another type of chopper-stabilized amplifier uses a parallel reference amplifier with feedback paths in parallel with the main amplifier. Although this circuit does not disconnect the inputs from the input source, the parallel amplifier significantly increases the cost and complexity of the circuit.

Another problem associated with prior art chopper-stabilized amplifiers is that the circuits could not easily distinguish between DC offsets, which should be corrected for, and small AC input voltages, which the correction circuitry should ignore. For example, in those instances where the AC input signal is at the same frequency as the chopper correction circuit frequency (known as the chopping frequency), previous offset correction circuits have sensed a voltage offset each cycle (which actually is the AC input signal) and have attemped to correct for it by erroneously shifting the voltage output. On the other hand, in the case where the input frequency is somewhat different from the chopping frequency, the circuit might sense a positive voltage (for example) for a few cycles, and then would sense a negative voltage for a few cycles. As a result of the correction circuitry attempting to correct for the AC input signal, the chopper circuitry was erroneously generating a new signal which was the difference between the chopping frequency and the input signal frequency. This is referred to as intermodulation distortion, and can also occur when the input signal is at or near integral multiples of the chopping frequency.

One method of attempting to solve the intermodulation problem has been to filter (attenuate) the input signal to the chopper circuitry occuring near the chopper frequencies. This can reduce the intermodulation problem but only at the expense of inhibiting the chopper circuitry from correcting for actual offsets occurring at the attenuated frequencies.

Still another problem associated with chopper-stabilized amplifiers has been the tendency of the chopper correction circuitry frequency response to add to the response of the main amplifier. As a result, in the region where the AC gain of both are falling (or "rolling off") at 6 db/octave, the composite amplifier AC gain rolls off at 12 db/octave, resulting in instability problems such as oscillation or extreme ringing.

SUMMARY OF THE INVENTION

It is an object of the present invention to provide an amplifier circuit which continuously and automatically corrects for amplifier offset error without necessitating disconnecting the inputs of the amplifier from the input signal source, and particularly in a manner requiring relatively uncomplicated electronic circuitry.

It is another object of the present invention to provide an amplifier which reduces or eliminates intermodulation distortion without corrupting the offset correction circuitry.

It is still another object of the present invention to provide an amplifier having an improved controlled roll-off of the AC gain so as to prevent oscillation or ringing.

A preferred embodiment of the present invention comprises an operational amplifier having two input legs and a reference leg. The amplifier provides an output which is proportional to the voltage differential at its inputs. The input legs and the reference leg each include an input transistor and a load transistor. During a first time period, the inputs of the first input transistor and reference input transistor of the first input leg and reference leg, respectively, are connected together. Should there be any imbalance between the reference leg and the first input leg due to transistor mismatch or some other cause, circuitry is provided which will sense the imbalance and adjust the input of the load transistor of the first leg to compensate for the imbalance. Similarly, during a second time period, the inputs of the second input transistor and reference input transistor are then connected together and any imbalance between the second input leg and reference leg is sensed and the input to the second load transistor is adjusted to balance the second input leg against the reference leg. With the first input leg so balanced against the reference leg and the second also balanced against the reference leg, the first input leg is balanced against the second input leg and the offset of the amplifier is significantly reduced or eliminated. At no time are the inputs to the amplifier disconnected from the input signal source so that the amplifier is at all times available to amplify the input signal. Accordingly, the output of the amplifier is not chopped or interrupted as with prior art chopper-stabilized amplifiers.

BRIEF DESCRIPTION OF THE DRAWINGS

FIG. 2 is a schematic diagram of an amplifier employing a preferred embodiment of the present invention;

DETAILED DESCRIPTION OF THE DRAWINGS

Figure 1:
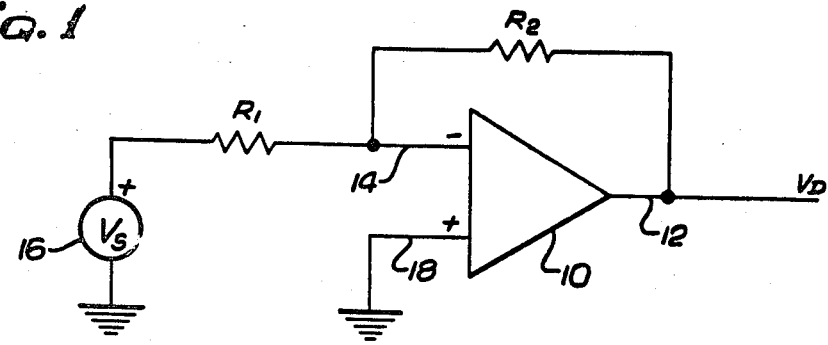
FIG. 1 is a schematic diagram of an operational amplifier configured as an inverting amplifier with a negative feedback loop.

Referring to FIG. 1, a monolithic integrated-circuit operational amplifier 10 is shown in an inverting amplifier application to provide an example of the operation of the preferred embodiment of the present invention. The circuitry shown in FIG. 1 represents a voltage-shunt feedback with the resistor $R_2$ providing a feedback path from the output 12 to the inverting or negative input 14 of the amplifier 10. An input source 16 provides an input signal $V_s$ and is connected to the inverting input 14 through a resistor $R_1$. The noninverting or positive input 18 of the amplifier 10 is grounded. For purposes of clarity, connections of the amplifier 10 to voltage sources and external capacitors are not shown.

The overall voltage gain $A_{vf}$ with feedback can be approximated by $$A_{vf} = -R_2/R_1$$

where the gain $A_v$ of the amplifier 10 is very large. When the input signal $V_s=0$, the output signal $V_o$ should also equal zero, since both inputs of the amplifier are grounded. However, if there is an imbalance in the amplifier, a nonzero output voltage will appear at the output 12 which will be referred back by the feedback path and an input offset voltage $V_{io}$ will appear which can be approximated by $$V_{io} = V_{oo} A_{vf}$$

where $V_{oo}$ is the output voltage when $V_s=0$.

Referring now to FIG. 2, a preferred embodiment of the operational amplifier 10 in accordance with the present invention will now be described which eliminates amplifier offset without necessitating the disconnection of the inputs from the input signal source. The amplifier 10 has a first input leg 20 which includes a p-channel input field-effect transistor (FET) 22, the drain of which is connected to the drain of an n-channel load FET 24. The amplifier 10 has a second input leg 26 which similarly includes a p-channel input FET 28 and an n-channel load FET 30.

The first input leg 20 and the second input leg 26 together form a main differential amplifier, with the sources of the input transistors 22 and 28 connected by a constant current source 32 to a positive voltage supply 34 and the sources of the load transistors 24 and 30 connected to the negative voltage supply 36 through a resistor 38. With the front gates of the load transistors 24 and 30 connected together to the drain of the load transistor 24 at a node 39, it is seen that the transistors 24 and 30 are configured as current repeaters or current mirrors. That is, the load transistor 30 attempts to conduct the same current as that which is conducted by the other load transistor 24 of the current mirror pair.

Thus, the input transistors 22 and 28 form a differential pair with the negative input 14 (FIG. 1) being delivered to the gate 41 of the first input transistor 22 and the positive input 18 being delivered to the gate 43 of the second input transistor 28. Accordingly, the first input leg 20 and the second input leg 26 will hereinafter be referred to as the negative input leg 20 and the positive input leg 26, respectively.

The voltage at the drain of the positive leg load transistor 30 at the node 40 is proportional to the voltage difference between the inputs 14 and 18. The node 40 is connected to the gate of an output FET 42. The FET 42 is connected to the negative supply 36, and also to the positive supply 34 through a constant current source 44.

If the amplifier 10 has no inherent offset, then equal voltages on the inputs 14 and 18 would induce the input transistors 22 and 28 of the negative and positive input legs, respectively, to conduct equal currents. Since the load transistors 24 and 30 of the input legs are configured as current mirrors, these transistors also tend to conduct equal currents and the two input legs 20 and 26 are, therefore, balanced. However, if the input transistors 22 and 28 are mismatched or there exists one of a variety of other causes of offset such as noise or temperature drift, then an imbalance between the input leg 20 and input leg 26 can occur.

For example, if the input 18 of the input transistor 28 must be more negative than the input 14 of the input transistor 22 to produce the same current in the transistors, then applying equal voltages to both inputs 14 and 18 will tend to produce a greater current through input transistor 22 than through input transistor 28. The load transistor 24 of the negative input leg 20 accommodates the current produced by the input transistor 22 with the load transistor 30 of the positive input leg 26 attempting to mirror or match the current through the load transistor 24. Since the load transistor 30 of the positive input leg attempts to conduct more current than that which is provided by the input transistor 28, if left uncorrected, the voltage at node 40 drops, causing the voltage at the output 12 to rise. This voltage displacement at the output is the output offset voltage which is referred back by the overall feedback loop (FIG. 1) to appear as the input offset voltage at the inputs 14 and 18.

In order to eliminate this offset voltage, a third input leg or reference leg 46 is provided which includes a p-channel reference input transistor 48 having a gate 49 and an n-channel load transistor 50. The source of the reference input transistor 48 is connected to the sources of the input transistors 22 and 28 and the source of the reference load transistor 50 is connected to the sources of the input leg load transistors 24 and 30. The combination of the reference leg 46 with the negative input leg 20 forms a second differential amplifier, with the input transistors 22 and 48 forming a second differential pair. The combination of the reference leg 46 with the positive input leg 26 forms a third differential amplifier, with the input transistors 28 and 48 forming a third differential pair. The gate of the reference load transistor 50 is connected to the gates of the other load transistors 24 and 30 at node 39 so that reference load transistor 50 is also a current mirror with transistor 24.

The output 52 at the drain of the reference load transistor 50 is connected to the gate of a reference amplifier 54. The output 56 of the reference amplifier 54 is connected to the positive voltage supply 34 by a constant current source 58, with the source of the reference amplifier 54 connected to the negative voltage supply 36.

In order to balance the negative input leg 20 against the positive input leg 26 so that any offset between the two input legs is compensated for, the negative input leg 20 is first balanced with respect to the reference leg 46, and then the positive input leg 26 is balanced against the reference leg 46. It is seen that with the reference leg balanced against both the input leg 20 and input leg 26, the input legs 20 and 26 will be balanced against each other.

To achieve balancing, a switch 60 is provided to short the inputs or gates 41 and 49 of the input transistors 22 and 48 of the legs 20 and 46, respectively, together so that the gates 41 and 49 are both connected to the input 14. As previously mentioned, the legs 20 and 46 form a differential amplifier such that with switch 60 closed, the voltage at the gates of the input transistors 22 and 48 are equal and the voltage at the output node 52 should be at midscale (where in this example, a voltage at the midscale point indicates no voltage differential at the inputs). However, if there exists an offset between the negative input leg 20 and the reference leg 46, the voltage at node 52 will be displaced from the midscale value. The voltage change at the node 52 will be amplified by the reference amplifier 54 such that the voltage at node 56 is also a function of the imbalance between the negative input leg 20 and the reference leg 46.

The output at node 56 is connected via a second switch 62 to the back gate 64 of the load transistor 24 as well as to a capacitor 66. The capacitor 66 is indicated in phantom since it is external to the monolithic chip. The switches 60 and 62 are closed at the same time, with the closed phase designated "A." The switches 60 and 62 can be FET's and are controlled by a controller 68 which performs a clocking function. The controller 68 can be any of a variety of well known clock circuits.

With the switches 60 and 62 closed (i.e., during the A phase), the external capacitor 66 is charged to the voltage level at node 56 of the reference amplifier 54. With a change in voltage at the back gate 64 of the negative load transistor 24, the voltage at the front gate of the load transistor 24 (at node 39) also changes. Since the front gate of the reference load transistor 50 is also connected to the node 39, the current conducted by the load transistor 50 of the reference leg 46 is changed and it changes in the direction which causes the voltage at node 52 to return to the midscale point. Thus, any voltage change at node 52, which is a function of the offset or imbalance between the negative input leg 20 and the reference leg 46, during the A phase, is amplified by the amplifier 54 and fed back to the back gate of the load transistors 24 such that the ratio of currents conducted by the load transistors 24 and 50 are modified to bring the reference leg 46 and negative input leg 20 back into balance.

At the end of the A phase and the start of the A phase, switches 60 and 62 open, disconnecting the gates of the input transistors 22 and 48 and disconnecting the output 56 of the reference amplifier 54 from the back gate 64 of the load transistor 24 of the negative input leg 20. During the A phase, a switch 70 connects the input 18 of the input transistor 28 of the positive input leg 26 to the gate 49 of the reference input transistor 48 of the reference leg 46. At the same time, a fourth switch 72 connects the output 56 of the reference amplifier 54 to the back gate 74 of the positive load transistor 30 and a second external capacitor 76.

Thus, during the A phase, the gates of the input transistors 28 and 48 of the positive input leg 26 and reference leg 46, respectively, are shorted together so that the voltage at node 52 responds to any offset or imbalance between the positive input leg 26 and the reference leg 46. This voltage is amplified by the amplifier 54 and fed back to the back gate 74 of the load transistor 30 through the switch 72 (which is closed during A phase), which also charges the capacitor 76 to the voltage at the output node 56 of the reference amplifier 54.

A change in the voltage at the back gate 74 of the load transistor 30 changes the current conducted by the load transistor 30 to balance the positive input leg 26 with the reference leg 46. With the positive input leg 26 balanced against the reference leg 46 during the A phase and the negative input leg 20 balanced against the reference leg 46 during the A phase, it is seen that the negative input leg is balanced against the positive input leg.

To illustrate the operation of the operational amplifier 10, it may be assumed, for example, that the load transistors 24 and 30 of the input legs are matched but that the input transistors 22 and 28 are mismatched, which if left uncorrected, would produce an offset. Similarly, in this example, the load transistor 50 of the reference leg 46 may be assumed to be matched with the load transistors 24 and 30 but the reference input transistor 48 is not matched with either of the other two input transistors 22 or 28. Also, the input signal $V_s$ shall be assumed to be equal to zero so that the output $V_o$ at node 12 is at the midscale point in the absence of any offset.

Accordingly, the gate 49 of the reference input transistor 48 may, for example, need to be more negative than the gate 41 of the negative input transistor 22 to produce the same output carrier. Thus, during the A phase in which the gates of the transistors 22 and 48 are connected together (and thus are at the same voltage), the negative input transistor 22 will tend to produce more current than the reference input transistor 48. The negative input leg load transistor 24 will accommodate the current provided by its corresponding input transistor 22 with the voltage at node 39 moving to the necessary level for the load transistor 24 to conduct that particular current level. Since the load transistors 50 and 24 are configured as current mirrors, the load transistor 50 of the reference leg 46 will try to conduct the same current as that which is conducted by the load transistor 24 of the negative input leg. However, since the reference input transistor 48 does not match the negative input transistor 22, the input transistor 48 attempts to conduct less current than the amount of current which the load transistor 50 tries to match. Accordingly, the voltage at node 52 goes down resulting in the voltage at the output node 56 of the reference amplifier 54 going up.

Since during the A phase switch 62 is closed, the capacitor 66 is charged to the voltage level at output node 56, and the back gate 64 of the load transistor 24 also rises with the rising voltage at output node 56. To maintain the level of current conduction through the load transistor 24, the voltage at the front gate of the load transistor 24 goes down as the voltage at the back gate 64 goes up. With the voltage at node 39 going down, the reference load transistor 50 tends to conduct less current, bringing it into agreement with the reference input transistor 48 which initially tended to produce less current than the negative input transistor. As a result, the voltage at node 52 returns to the midscale or balance point. In this manner, the voltages at the gates of the load transistors 24 and 50 are adjusted so that the ratio of the currents conducted by the load transistors 24 and 50 match the ratio of the currents which the input transistors 22 and 48 tend to produce as a result of their mismatch and the negative input leg 20 is brought into balance with the reference leg 46.

As for the other input leg 26, it can be assumed, in this example, that the gate 43 of the input transistor 28 must be more negative than the gate 49 of the reference input transistor 48 in order for these transistors to conduct the same current. Thus, during the A phase in which switches 70 and 72 are closed (and switches 60 and 62 are opened) such that the gates of the transistors 28 and 48 are shorted together, the reference input transistor 48 will tend to conduct more current than the positive input transistor 28. Again, the load transistors 50 and 30 are configured as current mirrors so that the reference load transistor 50 attempts to conduct the same current as the load transistor 30 which is conducting the same current as its corresponding input transistor 28.

Since the reference input transistor 48 tends to conduct more current than the positive input transistor 28, the transistor 48 tends to conduct more current than its corresponding load transistor 50 is trying to match. As a result, the voltage at node 52 rises which is amplified by the amplifier 54 such that the output voltage at 56 drops. The lower voltage at 56 is fed back by the closed switch 72 to the back gate 74 of the load transistor 30 of the positive input leg 26. This also discharges the external capacitor 76 to the voltage at node 56. With the voltage at the back gate 74 reduced, the current through the load transistor 30 is reduced so that the current ratio between the load transistors 50 and 30 will match the current ratio which the input transistors 48 and 28 of the reference and positive input legs, respectively, tend to produce because of the offset. In this manner, the positive input leg becomes balanced against the reference leg.

With the current through the positive load transistor 30 being reduced, the voltage at node 40 rises and moves closer to the midscale point. Accordingly, the voltage is thereby reduced at the output 12 such that it too moves closer to the midscale point. Thus, the output offset voltage is reduced which in turn reduces the input offset voltage through the overall feedback loop (FIG. 1). With a reduction in the input offset voltage, the current in the negative input leg 20 is increased and the current in the positive input leg 26 is reduced. When the negative input leg 20 achieves a balanced condition with respect to the positive input leg 26, the output 12 of the amplifier 10 will be at the midscale point (assuming the inputs 14 and 18 are at the same voltage) and the offset is eliminated. With a nonzero input signal $V_s$, the output $V_o$ is displaced from the midscale point as a function of $V_s$, but the offset is eliminated in the same manner.

Thus, it is seen that the amplifier 10 is capable of correcting the offset without disconnecting the inputs from the input signal source. As a result, the amplifier 10 can continuously amplify the input signal and does not have a chopped output.

An additional advantage of the amplifier 10 is related to the "common-mode" voltage of the inputs. The common-mode voltage of a differential amplifier is the average voltage of the two input signals. The common-mode rejection ratio is a rating parameter for amplifiers and is related to the change in offset voltage with a change in the common-mode voltage. The common-mode rejection ratio can be corrupted in previous amplifiers where, for example, the correction circuitry includes a separate reference amplifier which is not connected to the main amplifier inputs at all times. When the reference amplifier in these previous circuits is connected to the main amplifier inputs, the common-mode voltage of the reference amplifier must be brought up to the common-mode voltage of the main amplifier. This can be interpreted as an error signal which would corrupt the offset correction action. In the present invention, this problem is avoided since the reference leg 46 is always connected to one of the input legs 20 and 26 so that the reference leg 46 can be thought of as always experiencing the same common-mode voltage as the input legs 20 and 26. Thus, the amplifier 10 can maintain good dynamic balance since the high frequency common-mode rejection ratio should remain excellent and uncorrupted by the correction circuitry.

Another advantage of the amplifier 10 of FIG. 2 is that this circuit does not utilize a separate differential amplifier which acts as an absolute reference against which the main amplifier is compared. With prior art amplifiers of this type, any differences between the main amplifier and the reference amplifier are interpreted as offset errors and the main amplifier is adjusted accordingly. An inherent drawback of such a system is that if the reference amplifier is in error, then the correction circuitry erroneously corrects the main amplifier. In the present invention, however, the reference leg 46 does not provide an absolute standard but instead balances first one leg against itself and then the other input leg against itself, resulting in the two input legs becoming balanced against each other.

Furthermore, since the back gates 64 and 74 of the load transistors 24 and 30 of the input legs are used as the offset correction points, the correction action is independent of the common-mode voltage of the input pair 22 and 28. This provides additional accuracy to the correction circuitry.

The amplifier 10 also includes a feedback capacitor 80 which is connected between the output node 40 of the positive load transistor 30 and the output 12 of the output amplifier 42. With an AC input signal, or more specifically, with an AC output signal, the current through the capacitor 80 dynamically unbalances the positive input leg 26. This is the desired action to give the main amplifier comprising input legs 20 and 26 a controlled gain roll-off and finite AC gain, which enhances the stability of amplifier 10 and thus helps prevent ringing or oscillation.

The amplifier 10 also includes a second feedback capacitor 82 which is connected from the output 12 of the output amplifier 42 to the output 52 of the reference leg load transistor 50 through a switch 84. Switch 84 is closed during the A phase, as are switches 70 and 72. As the first feedback capacitor 80 pushes or pulls current into and out of, respectively, the node 40, the capacitor 82 similarly pushes and pulls a similar amount of current into and out of the node 52 during the A phase. Thus, with the positive input leg 26 and reference leg 46 being dynamically unbalanced by equal amounts compared to their static balance, no correction signal will be generated at node 52 during the A phase as a result of the AC input signal. Thus no signal having a frequency equal to the difference between the chopping frequency and the input signal frequency will be generated and the aforementioned intermodulation distortion problem is eliminated.

Figure 3:
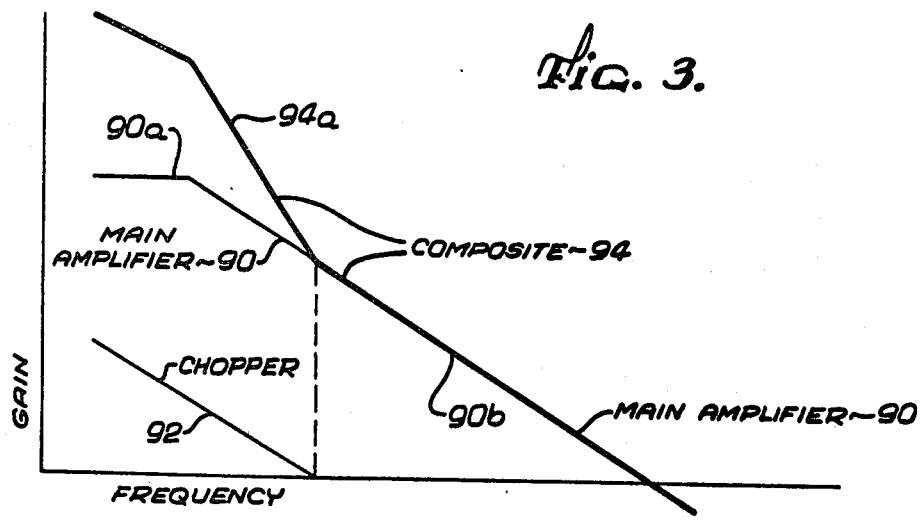
FIG. 3 is a graph of the frequency response of a prior art amplifier.

The addition of the second feedback capacitor 82 also has a very desirable effect on the open loop response of the amplifier 10. FIG. 3 is Bode plot which shows the open loop gain as a function of frequency for many prior art chopper-stabilized amplifiers. The outlines shown are straight line approximations of the frequency response, where the actual frequency response asymptotically approaches the straight lines shown. The gain of the main amplifier considered alone is represented by the outline 90 which has a region of relatively flat response at 90a and a region 90b where the response falls at 6 db per octave. The response of the chopper correction circuitry of prior art chopper-stabilized amplifiers is represented by the outline 92 which also falls at a rate of 6 db per octave. As shown in FIG. 3, the composite response of the amplifier comprising the main amplifier and chopper correction circuitry is additive, as represented by outline 94. This, in the regions where the responses of both the main amplifier and the chopper circuitry are falling at the rate of 6 db per octave, the response of the composite amplifier is 12 db per octave as indicated at 94a. As a result, severe ringing or oscillation can occur in that region of the frequency range.

Figure 4:
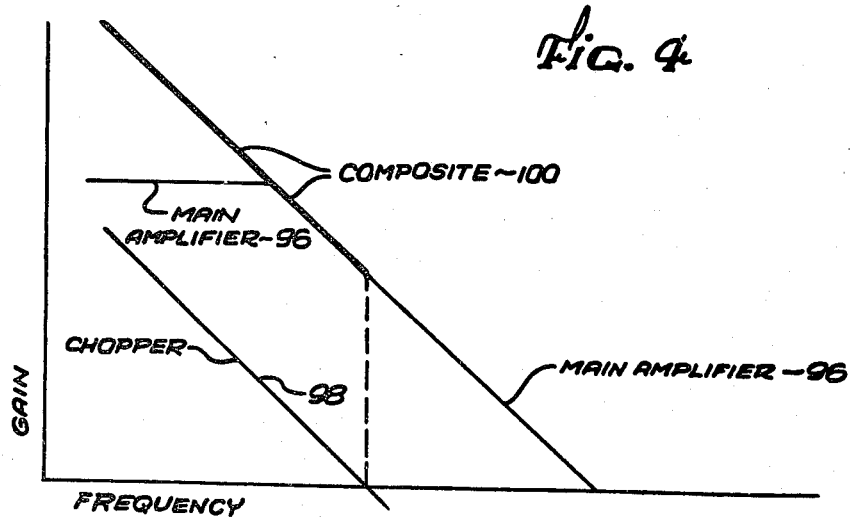
FIG. 4 is a graph of the frequency response of the amplifier of FIG. 2.

With the addition of capacitor 82, the frequency response of the amplifier 10 of FIG. 2 is represented by FIG. 4. The frequency response of the main amplifier is indicated at 96 and the response of the correction circuitry is indicated at 98. The response 96 of the main amplifier above may be similar to the response 90 of the main amplifier of FIG. 3 and the response 98 of the correction circuitry alone may be similar to the response 92 of the chopper circuitry of FIG. 3. However, although the main amplifier and correction circuitry considered individually may have responses similar to that shown in FIG. 3, the roll off 100 of the composite amplifier 10 is only 6 db per octave throughout the entire range. This is due to the fact that for amplifier 10, either the main amplifier or the correction circuitry is responsible for the output but both are not responsible at the same time. Accordingly, the stability of the amplifier is enhanced.

It will, of course, be understood that modifications of the present invention, in its various aspects, will be apparent to those skilled in art, some being apparent only after study and others being merely matters of routine electronic design. For example, the amplifier 10 can be designed utilizing other active elements such as bipolar transistors instead of field-effect transistors. Other embodiments are also possible with their specific designs dependent upon the particular application. As such, the scope of the invention should not be limited by the particular embodiment herein described but should be defined only by the appended claims and equivalents thereof. Various features of the invention are set forth in the following claims.

I claim:
1. An operational amplifier circuit comprising:
a first input leg having a first active input element and a first active load element;
a second input leg having a second active input element and a second active load element, said first leg and second leg being operably connected as a differential pair;
a reference leg having a reference active input element and a reference active load element, said reference leg being operably connected as a differential pair with the first leg and as a differential pair with the second leg;
switching means for operably connecting the inputs of the first active input element and the reference active input element together such that an offset between the first leg and the reference leg appears as a voltage change at an output of the reference active load element, and for operably connecting the output of the reference active load element to an input of the first active load element whereby the voltage at the input of the first active load element will be adjusted to compensate for any offset between the first leg and the reference leg to balance the first leg and reference leg, said switching means also for operably connecting the inputs of the second active input element and the reference active input element together while operably connecting an output of the reference active load element to an input of the second active load element whereby the voltage at an input of the second active load element will be adjusted to compensate for any offset between the second leg and the reference leg to balance the second leg and the reference leg;
whereby the first leg and the second leg will also be balanced with respect to each other.

2. The circuit of claim 1 further comprising a reference amplifier for amplifying the output of the reference active load element, said switching means alternately connecting the output of the reference amplifier to an input of the first active load element and to an input of the second active load element.

3. The circuit of claim 1 wherein each active load element comprises an FET having a back gate input and a front gate input.

4. The circuit of claim 3 wherein the output of the reference load FET is alternately operably connected by the switching means to the back gate of the first load FET and then to the back gate of the second load FET.

5. The circuit of claim 1 further comprising a first capacitor for storing the voltage applied to the input of the first active load element through the switching means and a second capacitor for storing the voltage applied to the input of the second active load element through the switching means.

6. The circuit of claim 1 wherein the active load elements are configured as current mirrors.

7. The circuit of claim 1 further comprising an output amplifier operably connected to the output of the second active load element wherein the output of the output amplifier is the output of the circuit.

8. The circuit of claim 7 further comprising a first feedback capacitor operably connected between the output of the output amplifier and the output of the second active load element to provide a roll off of the AC gain of the circuit, and a second feedback capacitor, said switching means having means for operably connecting the second feedback capacitor between the output amplifier output and the reference active load element output while the inputs of the second active input element and reference active input element are connected together so that if the first feedback capacitor dynamically unbalances the second leg as a result of a AC input signal, the second feedback capacitor similarly unbalances the reference leg whereby no imbalance between the second input leg and the reference leg is caused by the AC input signal.

9. An integrated circuit operational amplifier chip for connecting to a pair of external capacitors, comprising:
a first constant current source;
a load resistor;
a first input leg comprising a p-channel input FET and an n-channel load FET having a front gate and a back gate with the drain of the first load FET connected to the drain of the first input FET;
a second input leg comprising a p-channel input FET and an n-channel load FET having a front gate and a back gate with the drain of the second load FET connected to the drain of the second input FET;
a reference leg comprising a p-channel input FET and an n-channel load FET having a front gate and a back gate with the drain of the reference load FET connected to the drain of the reference input FET, the sources of each input FET being connected to the current source, the source of each load FET being connected to the load resistor and the front gates of each load FET being connected to the drain of the first load FET whereby the three load FET's are configured as current mirrors and any two of the reference leg and input legs form a differential pair;
a first switch operably connecting the gate of the first input FET to the gate of the reference input FET;
a second switch operably connecting the gate of the second FET to the gate of the reference FET;
a second current source;
a reference amplifier FET having a gate connected to the drain of the reference load FET and a drain connected to the second current source;
a third switch connecting the drain of the reference amplifier FET to the back gate of the first load FET and to an external connection pin for connecting to a first external capacitor;
a third current source;
an output amplifier FET having a gate connected to the drain of the second load FET, and a drain connected to the third current source;
a fourth switch connecting the drain of the reference amplifier FET to the back gate of the second load FET and to a second external connection pin for connecting to a second external capacitor;
control means for opening the second and fourth switches and closing the first and third switch wherein any offset between the first input leg and the reference leg shifts the voltage at the drain of the reference load FET which shifts the voltage at the drain of the reference amplifier FET, which shifts the voltage at the back gate of the first load FET, which shifts the voltage at the front gates of the first and reference load FET's so that the currents through the first input leg and reference leg are balanced, said control means also for opening the first and third switches and closing the second and fourth switches wherein any offset between the second input leg and the reference leg shifts the voltage at the drain of the reference load FET, which shifts the voltage at the drain of the reference amplifier FET, which shifts the voltage at the back gate of the second load FET, which shifts the voltage at the drain of the second load FET which shifts the voltage at the drain of the output amplifier FET so that the currents through the second input leg and the reference leg are balanced;
whereby the first input leg and second input leg are balanced with respect to the reference leg and thereby balanced with respect to each other.

10. The chip of claim 9 further comprising:
a first feedback capacitor connected between the drain of the output amplifier FET and the drain of the second load FET to provide a roll off of the AC gain;
a second feedback capacitor connected at one end to the drain of the output amplifier FET; and
a fifth switch connecting the other end of the second feedback capacitor to the drain of the reference load FET;
said control means having means for closing the fifth switch while the second and fourth switches are closed so that when the first feedback capacitor dynamically unbalances the second input leg as a result of an AC input signal, the second feedback capacitor equally unbalances the reference leg whereby no imbalance between the second input leg and the reference leg is caused by the AC input signal.

11. A operational amplifier circuit comprising:
a first differential input leg;
a second differential input leg;
a reference differential input leg with each of the input legs having a load transistor with the load transistors being configured as current mirrors;
switch means for alternately connecting the inputs of the first leg and the reference leg together during a first period so that any imbalance between the first and reference legs appears as a voltage change at the output of the reference load transistor and for connecting the inputs of the second leg and the reference leg during a second period so that any imbalance between the second and reference legs appears as a voltage change at the output of the reference load transistor; and
feedback means for feeding back the voltage change at the output of the reference load transistor to inputs of the load transistors so that the currents through the load transistors and the voltages at the inputs of the load transistors are adjusted to balance the first input leg against the reference leg during the first period and the second leg against the reference leg during the second period whereby the first input leg is balanced against the second input leg.

12. The circuit of claim 11 further comprising:
an output amplifier operably connected to the output of the second load transistor;
a first feedback capacitor operably connected between the outputs of the output amplifier and the second load transistor to provide a roll off of the AC gain; and a second feedback capacitor;

said switch means having means for operably connecting the second feedback capacitor between the outputs of the output amplifier and the reference load transistor during the second period while the inputs of the second leg and reference leg are connected together so that when the first feedback capacitor unbalances the second input leg, the second feedback capacitor equally unbalances the reference leg whereby no imbalance between the second input leg and the reference leg is caused by the AC input signal.

13. The circuit of claim 11 wherein the feedback means includes a reference amplifier for amplifying the output of the reference load transistor.

14. The circuit of claim 13 wherein each input leg load transistor comprises an FET having a front gate and a back gate and the feedback means feeds the voltage at the output of the reference amplifier to the back gate of the first leg load FET during the first period and feeds back the output of the reference amplifier to the back gate of the second leg load FET during the second period.

15. The circuit of claim 14 further comprising a first capacitor connected to the back gate of the first leg load FET to hold the voltage applied by the reference amplifier during the first period, and a second capacitor connected to the back gate of the second leg load FET to hold the voltage applied by the reference amplifier during the second period.

16. An operational amplifier circuit comprising:

a main amplifier having first and second differential input legs;

a reference leg;

comparison means for comparing the reference leg to the first differential input leg and to the second differential input leg to determine the presence of any offset between the reference leg and the first input leg or between the reference leg and the second input leg;

means responsive to the comparison means for adjusting the relative currents through the first and second input legs and the reference leg to compensate for any offset between the reference leg and the first input leg or between the reference leg and the second input leg whereby any offset between the first and second input legs is also compensated for.

* * * * *